United States Patent [19]

Tanaka et al.

[11] Patent Number: 5,336,362
[45] Date of Patent: Aug. 9, 1994

[54] METHOD FOR PREPARING YTTRIUM 66 BORIDE CRYSTAL FOR SOFT X-RAY MONOCHROMATOR

[75] Inventors: Takaho Tanaka, Tsukuba; Yutaka Kamimura, Tsuchiura; Shigeki Otani; Yoshio Ishizawa, both of Tsukuba, all of Japan

[73] Assignee: National Institute for Research in Inorganic Materials, Tsukuba, Japan

[21] Appl. No.: 962,871

[22] Filed: Oct. 19, 1992

[30] Foreign Application Priority Data

Feb. 29, 1992 [JP] Japan .................................. 4-078875

[51] Int. Cl.$^5$ .............................................. C30B 13/04
[52] U.S. Cl. ........................................ 117/42; 117/944
[58] Field of Search ............. 156/620.2, 620.7, 620.71, 156/DIG. 61, DIG. 63

[56] References Cited

PUBLICATIONS

"Preparation of Single Crystals of YB$_{66}$"; Tanaka et al., *Journal of Crystal Growth* 73 (1985) pp. 31–36.
"Growth of High Quality Single Crystals of YB$_{66}$"; Tanaka et al.; *Journal of Crystal Growth* 99 (1990); pp. 994–997.

*Primary Examiner*—R. Bruce Breneman
*Assistant Examiner*—Felisa Garrett
*Attorney, Agent, or Firm*—Oblon, Spivak, McClelland, Maier & Neustadt

[57] ABSTRACT

It is an object of the present invention to obtain a high quality YB66 crystal by lowering the temperature of the molten zone and growing a crystal by deposition growth under an incongruent condition. A method for preparing a yttrium 66 boride crystal by the floating zone method by use of a YB66 polycrystalline rod. A YB66 crystal having a composition with an atomic ratio B/Y within a range of from 50 to 75, is grown under such conditions that the melt has a composition (an atomic ratio B/Y) different from the raw YB66 polycrystalline rod and the growing YB66 crystal, and that an equilibrium is maintained at the growth interface. When the atomic ratio B/Y of the starting material is within the range of from 50 to 62 and the atomic ratio B/Y of the melt is within the range of from 40 to 62, it is possible to attain the atomic ratio B/Y of the growing crystal within the range of from 50 to 62. When the atomic ratio B/Y of the starting material is within the range of from 62 to 75 and the atomic ratio B/Y of the melt is within the range of from 62 to 93, it is possible to attain the atomic ratio B/Y of the growing crystal within the range of from 62 to 75.

1 Claim, 1 Drawing Sheet

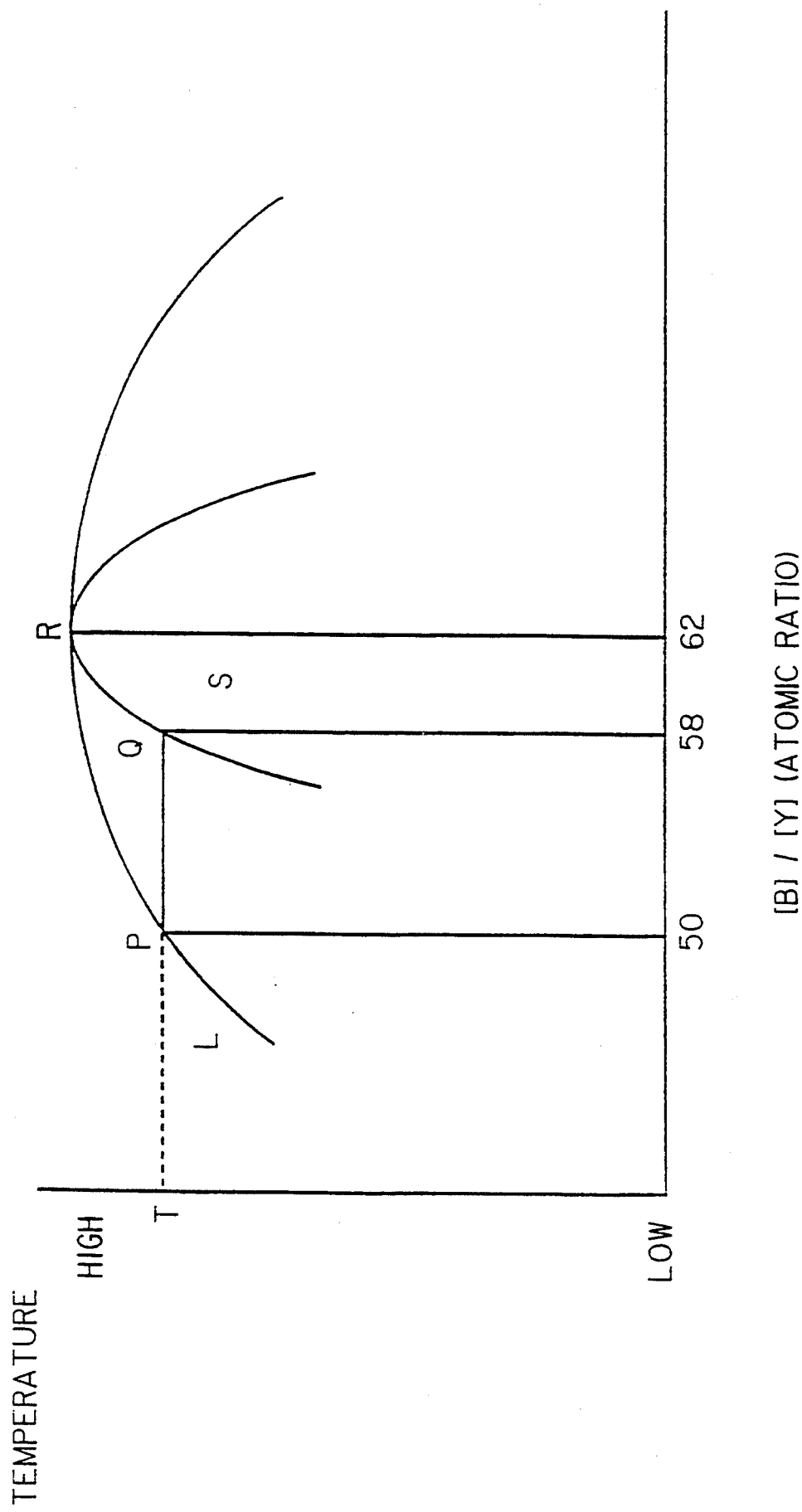

METHOD FOR PREPARING YTTRIUM 66 BORIDE CRYSTAL FOR SOFT X-RAY MONOCHROMATOR

BACKGROUND OF THE INVENTION

1. Field of the Invention

The present invention relates to a method for preparing a so-called yttrium 66 boride (hereinafter referred to as "YB66") crystal which is useful for soft X-ray monochromator.

2. Discussion of Background

YB66 has a large lattice constant (23.4 Å) and excellent properties as a monochromator crystal which can monochromatize a soft X-ray in energy region from 1,070 electron volt to 3,000 electron volt by using a (400) reflection with a lattice d spacing of 5.86 Å without any intrinsic absorption. Further, YB66 is hard and has high mechanical strength, and it is hardly destroyed by irradiation by strong synchrotron beam. Thus, YB66 is useful as a soft X-ray monochromator crystal for synchrotron radiation.

A floating zone method has been known as a method for preparing a YB66 crystal, wherein a raw polycrystalline rod having an atomic composition ratio of B/Y=62 which is a congruent melting composition as indicated by point R in the YB66 phase diagram in FIG. 1, is melted to form a molten zone. Then, the molten zone having the atomic ratio of B/Y=62 is zone-passed, whereby a crystal having the atomic ratio of B/Y=62 is grown.

However, in this floating zone growth, since the molten zone is formed by melting the raw polycrystalline rod having the atomic composition ratio of B/Y=62 which is the congruent melting composition, the growth is carried out under the condition that the composition of the polycrystalline rod is coincident with those of the molten zone and the growing crystal. For this reason, the growth of the crystal is carried out at the highest melting point by solidifying the melt, and thus it is not easy to obtain a high quality crystal.

SUMMARY OF THE INVENTION

It is an object of the present invention to solve the above-mentioned problem and to provide a method for obtaining a high quality YB66 crystal by reducing the temperature of the molten zone and changing the growth mode from melt growth to deposition growth.

To accomplish the above object, the present inventors have made extensive studies with respect to a new crystal-growing method taking into consideration that the drawbacks of the conventional technique are due to the formation of the molten zone by melting the forward end of a starting material rod by heating, and have arrived at the present invention.

The present invention provides a method for preparing the YB66 crystals by the floating zone method under an incongruent condition. The growth under the incongruent condition means that a composition of the molten zone is different from those of the YB66 raw polycrystalline rod and the growing crystal and both compositions are in equilibrium at the growth interface. The crystals grown under the incongruent condition have one composition in a range from B/Y=50 to 75.

BRIEF DESCRIPTION OF THE DRAWING

FIG. 1 is a YB66 phase diagram.

DETAILED DESCRIPTION OF THE PREFERRED EMBODIMENTS

The present invention will be described in more detail.

In the present invention, high quality crystals are obtained by controlling the composition of the molten zone different from those of the raw polycrystalline rod and the growing crystal so as to both compositions are in equilibrium at the growth interface. This reduces the temperature of the molten zone and changes the growth mode to deposition growth.

Here, the floating zone crystal growth under the incongruent condition will be explained. Referring to the phase diagram of YB66 in FIG. 1 where L designates a liquid phase and S designates a solid phase, a liquid phase (a molten zone) designated by point P at which an atomic ratio of B/Y is 50 and a solid phase (a raw polycrystalline rod and a crystal) designated by point Q at which an atomic ratio of B/Y is 58, can coexist at the temperature T. Thus, the crystal can be grown under the condition that the temperature of the molten zone is T and the atomic composition ratio of the molten zone and the atomic composition ratios of the raw polycrystalline rod and the growing crystal are 50 and 58, respectively, which are in equilibrium at the growth interface.

For example, a recommended method is as follows. A YB66 polycrystalline chip whose composition is coincident with that of a liquid phase and is in equilibrium with the composition of the solid YB66 raw polycrystalline rod, is sandwiched between the polycrystalline rod and a seed crystal. A molten zone is formed by melting the chip. After then, a single crystal is grown under the incongruent condition that the molten zone has a composition different from those of the raw polycrystalline rod and the single crystal growing from the molten zone.

For the compositions of the raw polycrystalline rod, the molten zone and the growing crystal, the following embodiments are available.

As a first embodiment, the atomic ratio B/Y of the raw YB66 polycrystalline rod is within a range of from 50 to 62, the atomic ratio B/Y of the melt is within a range of from 40 to 62, and the atomic ratio B/Y of the growing crystal is selected within a range of from 50 to 62.

As a second embodiment, the atomic ratio B/Y of the raw YB66 polycrystalline rod is within a range of from 62 to 75, the atomic ratio B/Y of the melt is within a range of from 62 to 93 and the atomic ratio B/Y of the growing crystal is selected within a range of from 62 to 75.

The difference between the first embodiment and the second embodiment is that, in the first embodiment, the atomic ratio B/Y of the growing crystal is larger than that of the melt, and the growing crystal contains a larger amount of boron than the melt. In the second embodiment, the atomic ratio B/Y of the growing crystal is smaller than that of the melt, and the growing crystal contains a smaller amount of boron than the melt. Both embodiments have advantages that a crystal having a desired composition can be grown and that under both conditions, the temperature of the molten zone can be lowered and the crystal can be grown by deposition growth.

Now, the present invention will be described in more detail with reference to example. However, it should be understood that the present invention is by no means restricted by such specific example.

EXAMPLE

Amorphous B powder and yttrium oxide ($Y_2O_3$) powder were mixed so that the atomic ratio B/Y after the reaction would be 58, and reacted at about 1,800° C. followed by pulverization. Further, stainless steel contamination incorporated during the pulverization process was leached by an acid and decanted to obtain a raw YB66 powder. Camphor was added as a binder to the starting material. The powder was pressed by a cold isostatic press (CIP) at a pressure of 2.3 ton.cm$^{-2}$ to form a cylindrical rod having a diameter of 12 mm and a length of 160 mm. The compact rod was sintered in vacuum at 1,900° C. for 60 minutes to obtain a raw YB66 polycrystalline rod.

Further, separately from the above-mentioned rod, amorphous B powder and yttrium oxide powder were mixed so that the atomic ratio B/Y would be 50 after the reaction, and the same operations above-mentioned were carried out. From the resulting polycrystalline rod, a cylindrical rod having a diameter of 12 mm and a length of 14 mm was cut out to obtain a chip for forming the molten zone.

A tungsten ring used for a floating zone method had an inner diameter of 20 mm, an outer diameter of 22 mm and a length of 14 mm and tungsten wires having a diameter of 0.5 mm, spot-welded for support. A BN spacer was mounted on a work coil for induction heating. The tungsten ring hung by supporting tungsten wires was mounted on the BN spacer so that the center of the ring would be aligned in order to coincide with the center of the work coil.

Further, the raw polycrystalline rod was set above the tungsten ring, and a cylindrical seed crystal with an axial orientation of [100] having the same diameter with the raw polycrystalline rod was placed under the tungsten ring. A chip for forming the molten zone was sandwiched, between the lower end of the raw polycrystalline rod and the upper end of the seed crystal. The boundary between the seed crystal and the chip for forming the molten zone was adjusted to come 5 mm above the lower end of the tungsten ring. A furnace was pressurized by He gas atmosphere at 5 atm. The tungsten ring was heated up at temperature of 2,400° C. to melt the chip for forming a molten zone. After adjusting the shape of the molten zone, the seed crystal and the polycrystalline rod were driven downward. The drive speeds at that time were 35 mm/h for the seed crystal and 60 mm/h for the polycrystalline rod, respectively, and only the seed crystal was rotated at 6 rpm. The YB66 crystal was thereby grown.

In order to obtain high crystallographic quality enough for the use as a soft X-ray monochromator, the zone pass was repeated by using the YB66 crystal grown as mentioned above as a starting material rod. For this purpose, the YB66 crystal was cut out together with the frozen molten zone and disposed above the tungsten ring so that the molten zone would be the lower end. A seed crystal was disposed under the tungsten ring. The molten zone at the lower end was melted again and touched to the seed crystal located below. After equilibrated sufficiently, the seed crystal and the YB66 crystal rod used as the starting material were driven downward. The crystal growth to obtain a high quality YB66 crystal was thus carried out. The drive speed at this time was 10 mm/h for both of the feed YB66 crystal rod and the seed crystal. Further, only the seed crystal was rotated at 6 rpm.

The high quality YB66 crystal thus grown had an atomic ratio B/Y of 58, and had high quality and large size enough for the above-mentioned application throughout the substantially whole body.

As described in detail, according to the present invention, a high quality YB66 crystal can be obtained because the temperature of the molten zone is lowered and the crystal can be grown by deposition growth.

What is claimed is:

1. A method for preparing a yttrium 66 boride crystal comprising growing by the floating zone method a YB66 crystal having a composition with an atomic ratio B/Y within a range of from 50 to 75 by use of a YB66 polycrystalline rod, a seed crystal and a YB66 polycrystalline chip sandwiched between said YB66 rod and said seed crystal under conditions such that the molten zone has an atomic ratio B/Y different from said YB66 rod and the growing crystal and an equilibrium is maintained at the growth interface, wherein said YB66 chip has the same composition with that of the molten zone and said YB66 crystal is grown by using the molten zone formed by melting said YB66 chip.

* * * * *